US006658641B2

United States Patent
Ashida et al.

(10) Patent No.: US 6,658,641 B2
(45) Date of Patent: Dec. 2, 2003

(54) METHOD FOR MASK DATA VERIFICATION AND COMPUTER READABLE RECORD MEDIUM RECORDING THE VERIFICATION PROGRAM

(76) Inventors: Isao Ashida, c/o Sony Corporation 7-35, Kitashinagawa 6-Chome, Shinagawa-ku, Tokyo (JP); Kazuhisa Ogawa, c/o Sony Corporation 7-35, Kitashinagawa 6-Chome, Shinagawa-ku, Tokyo (JP)

( * ) Notice: Subject to any disclaimer, the term of this patent is extended or adjusted under 35 U.S.C. 154(b) by 0 days.

(21) Appl. No.: 09/981,863

(22) Filed: Oct. 17, 2001

(65) Prior Publication Data

US 2002/0066069 A1 May 30, 2002

(30) Foreign Application Priority Data

Oct. 20, 2000 (JP) ........................................ 2000-317332

(51) Int. Cl.[7] ........................ G06F 17/50; G06F 19/00; G06K 9/03
(52) U.S. Cl. ........................ 716/21; 700/110; 700/120; 700/121; 430/5; 378/35; 382/144
(58) Field of Search .............. 716/19–21; 700/108–110, 700/120–121; 430/4–5; 378/34–35; 382/144

(56) References Cited

U.S. PATENT DOCUMENTS

| | | | | |
|---|---|---|---|---|
| 5,046,109 A | * | 9/1991 | Fujimori et al. | 382/144 |
| 5,475,766 A | * | 12/1995 | Tsuchiya et al. | 382/144 |
| 5,614,420 A | * | 3/1997 | Sheu et al. | 438/16 |
| 5,698,859 A | * | 12/1997 | Haruki | 250/492.22 |
| 5,786,112 A | * | 7/1998 | Okamoto et al. | 430/5 |
| 5,795,688 A | * | 8/1998 | Burdorf et al. | 430/30 |
| 5,978,501 A | * | 11/1999 | Badger et al. | 382/144 |
| 5,991,006 A | * | 11/1999 | Tsudaka | 355/53 |
| 6,002,791 A | * | 12/1999 | Okada | 382/144 |
| 6,078,738 A | * | 6/2000 | Garza et al. | 716/21 |
| 6,081,659 A | * | 6/2000 | Garza et al. | 716/21 |
| 6,091,845 A | * | 7/2000 | Pierrat et al. | 382/144 |
| 6,110,647 A | * | 8/2000 | Inoue et al. | 430/312 |
| 6,137,901 A | * | 10/2000 | Harazaki | 382/144 |
| 6,154,563 A | * | 11/2000 | Tsudaka | 382/144 |
| 6,171,731 B1 | * | 1/2001 | Medvedeva et al. | 430/5 |
| 6,222,195 B1 | * | 4/2001 | Yamada et al. | 250/492.2 |

(List continued on next page.)

FOREIGN PATENT DOCUMENTS

| JP | 359105318 A | * | 12/1982 | ........... H01L/21/30 |
|---|---|---|---|---|
| JP | 2000049072 A | * | 2/2000 | ......... H01L/21/027 |

OTHER PUBLICATIONS

Allan et al., "Critical Area Extraction for Soft Fault Estimation", IEEE Transactions on Semiconductor Manufacturing, vol. 11, N 1, Feb. 1998, pp. 146–154.*

Chen et al., "Analysis of the Impact of Proximity Correction Algorithms on Circuit Performance", IEEE Transactions on Semiconductor Manufacturing, vol. 12, No. 3, Aug. 1999, pp. 313–322.*

*Primary Examiner*—Matthew Smith
*Assistant Examiner*—Phallaka Kik
(74) *Attorney, Agent, or Firm*—Robert J. Depke; Holland & Knight LLC

(57) ABSTRACT

An object of the present invention is to accurately verify errors, etc., in programs when corrections of mask data are carried out by the programs. In order to correct the mask data based on predetermined conditions, a method for mask data verification according to the present invention comprises the steps of preparing corrected mask data by using a plurality of programs each of which has a different algorithm, comparing each of corrected mask data which is prepared in the previous step and as a result of the comparison, if there are differences among the corrected mask data, extracting errors which cause problems as mask data from the differences.

2 Claims, 6 Drawing Sheets

U.S. PATENT DOCUMENTS

| | | | | |
|---|---|---|---|---|
| 6,245,466 B1 | * | 6/2001 | Kotani et al. | 430/5 |
| 6,249,597 B1 | * | 6/2001 | Tsudaka | 382/144 |
| 6,272,236 B1 | * | 8/2001 | Pierrat et al. | 382/144 |
| 6,303,251 B1 | * | 10/2001 | Mukai et al. | 430/5 |
| 6,335,981 B1 | * | 1/2002 | Harazaki | 382/144 |
| 6,337,162 B1 | * | 1/2002 | Irie | 430/5 |
| 6,343,370 B1 | * | 1/2002 | Taoka et al. | 716/21 |
| 6,351,684 B1 | * | 2/2002 | Shirley et al. | 700/121 |
| 6,363,296 B1 | * | 3/2002 | Schulze | 700/125 |
| 6,400,838 B2 | * | 6/2002 | Watanabe | 382/144 |
| 6,453,457 B1 | * | 9/2002 | Pierrat et al. | 716/19 |
| 6,482,557 B1 | * | 11/2002 | Chen et al. | 430/30 |
| 6,485,870 B1 | * | 11/2002 | Uchikawa | 430/5 |
| 6,487,711 B1 | * | 11/2002 | Koike | 716/19 |
| 2002/0001759 A1 | * | 1/2002 | Ohashi et al. | 430/5 |
| 2002/0187406 A1 | * | 12/2002 | Magome et al. | 430/5 |

* cited by examiner

METHOD FOR MASK DATA VERIFICATION AND COMPUTER READABLE RECORD MEDIUM RECORDING THE VERIFICATION PROGRAM

BACKGROUND OF THE INVENTION

1. Field of the Invention

The present invention relates to a method for mask data verification in order to verify whether mask pattern data used in a manufacturing process of semiconductor devices, etc. is proper and a computer readable record medium recording the verification program 2. Description of the Related Art When preparing mask patterns for manufacturing semiconductor devices, for the purpose of improving a margin of accuracy of wafer patterning, etc., correction processes accompanied by changes in the shapes of patterns, which are typified by the optical proximity effect corrections, have been used with growing frequency.

Among the correction processes, for example, in a case of a rule-based one-dimensional optical proximity effect correction (hereinafter referred to as OPC), there is a method to carry out a correction process as shown in FIG. 1 by providing, for example, correction conditions shown in Table 1.

TABLE 1

| Line width to be corrected | Space width to be corrected | | | |
|---|---|---|---|---|
| | a | b | c | ... |
| A | $\alpha$ | $\beta$ | $\gamma$ | ... |
| B | $\delta$ | $\epsilon$ | $\zeta$ | ... |
| C | $\eta$ | $\theta$ | $\iota$ | ... |
| . | . | . | . | |
| . | . | . | . | |
| . | . | . | . | |

In the case of an example shown in Table 1 and FIG. 1, for each of the line widths of a mask pattern to be corrected, its correction amount is determined by a relationship with a distance to an adjacent pattern. In a mask pattern P1 shown in FIG. 1, the line width is B, and a distance to an adjacent pattern P2 is a, so $\delta$ is obtained from the correction amounts shown in Table 1. As a result, the line width B of the mask pattern P1 to be corrected is extended by a portion of $\delta$.

Thus, operations to determine the correction amount of the mask pattern and to carry out the correction are generally implemented by software on a computing apparatus.

In a process of calculating the correction amount by the software, when the correction process is not properly carried out due to some reason such as a sporadic error of the computing apparatus (memory error, etc.) and a calculation error based on an algorithm, an abnormal mask pattern is prepared so as to lead a significant problem in the manufacture of the semiconductor devices, etc. It is, therefore, required to verify whether the mask pattern is properly corrected.

However, such correction process of the mask pattern involves a change in the shape of the pattern, so it is difficult to easily verify whether the correction process is properly carried out.

Various techniques for the mask pattern verification have been previously disclosed.

For example, there is a method for verification that several check points are set on a pattern, and lengths at the check points are artificially measured by some means. In the method, when measured results are properly complied with the correction conditions, it is considered that the whole pattern is proper. However, this verification method is effective to detect a problem which affects the whole pattern, such as a mistake in the correction conditions, but other problems cannot be verified unless otherwise a problem at any of the check points accidentally occurs.

Also, as disclosed in the Japanese laid-open patent publication No. Hei. 11-174659, there is a method for verification to verify whether there is a change in a pattern which exceeds the maximum correction amount shown in a correction table which is used. The method can be implemented on both a pattern to be corrected and a corrected pattern by relatively simple graphic computations, though the method cannot verify in a case where the abnormality of the pattern resulting from an arising problem does not exceed the maximum correction amount.

Further, as disclosed in the Japanese laid-open patent publication No. Hei. 11-184064 and Hei. 11-282151, there are methods to verify by using a simulation whether the corrected result of a pattern is resolved without any trouble in a lithography process. However, the methods are to assure that the corrected result of the pattern cause no trouble in the lithography process, but not to assure the corrected mask pattern is a designed one. Also, there is a problem that the verification by using the simulation requires enormous amounts of time.

SUMMARY OF THE INVENTION

The present invention has been achieved to overcome such problems. A method for mask data verification according to the invention comprises the steps of preparing corrected mask data by each of a plurality of programs which has a different algorithm for the mask data, comparing each of the corrected mask data which is prepared in the previous step, and as a result of the comparison, if there is a difference among the corrected mask data, extracting an error which causes a problem as mask data from the difference.

The method for mask data verification further comprises the steps of preparing corrected mask data by each of a plurality of programs which has a different algorithm for the mask data, comparing each of the corrected mask data which is prepared in the previous step, and as a result of the comparison, if there are a plurality of differences among the corrected mask data, eliminating errors which cause no trouble as mask data from the differences and extracting errors which cause trouble as mask data from the remaining differences.

In this invention, in order to carry out corrections to the mask data based on predetermined conditions, corrected mask data is prepared by each of the plurality of programs which has a different algorithm. Although each of the programs has a different algorithm, its purpose is the same, so if the same correction conditions are used, each of the programs outputs an identical corrected mask data with one another. Therefore, as a result of comparing each of the corrected mask data which are prepared by the programs, if there are differences, errors which cause problems as mask data are extracted from the differences so that the verification of the mask data can be properly carried out.

Other and further objects, features and advantages of the invention will appear more fully from the following description.

DETAILED DESCRIPTION OF THE PREFERRED EMBODIMENT

Figure 1:
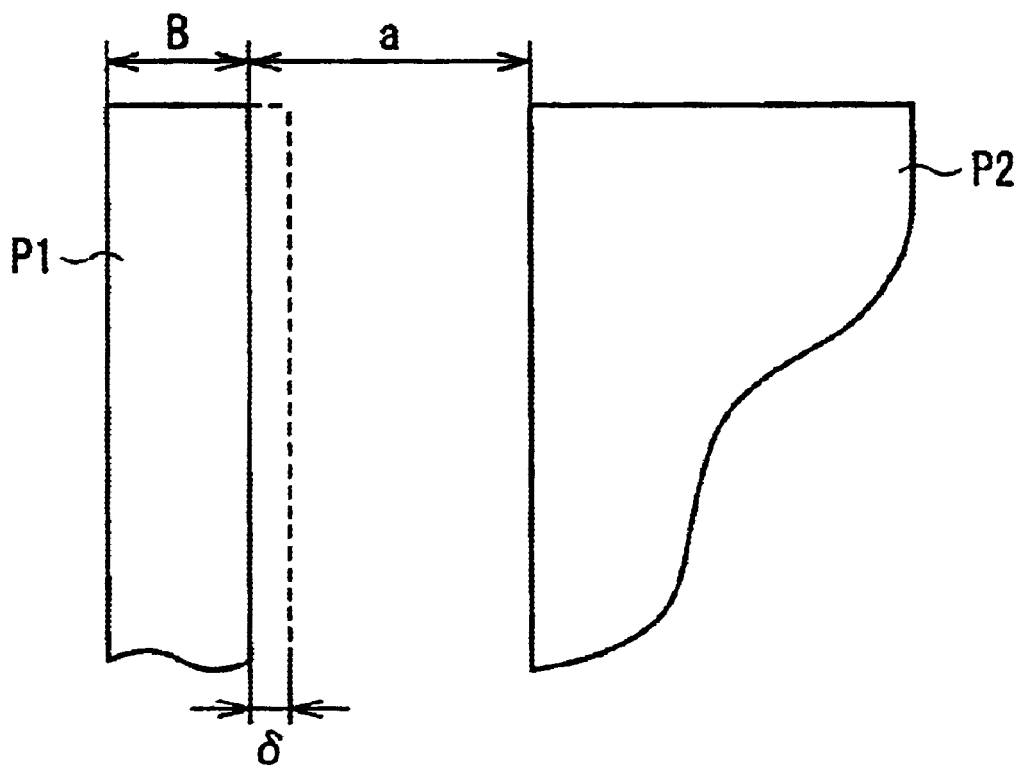
FIG. 1 is a schematic diagram showing an example of a mask pattern correction.
Figure 2:
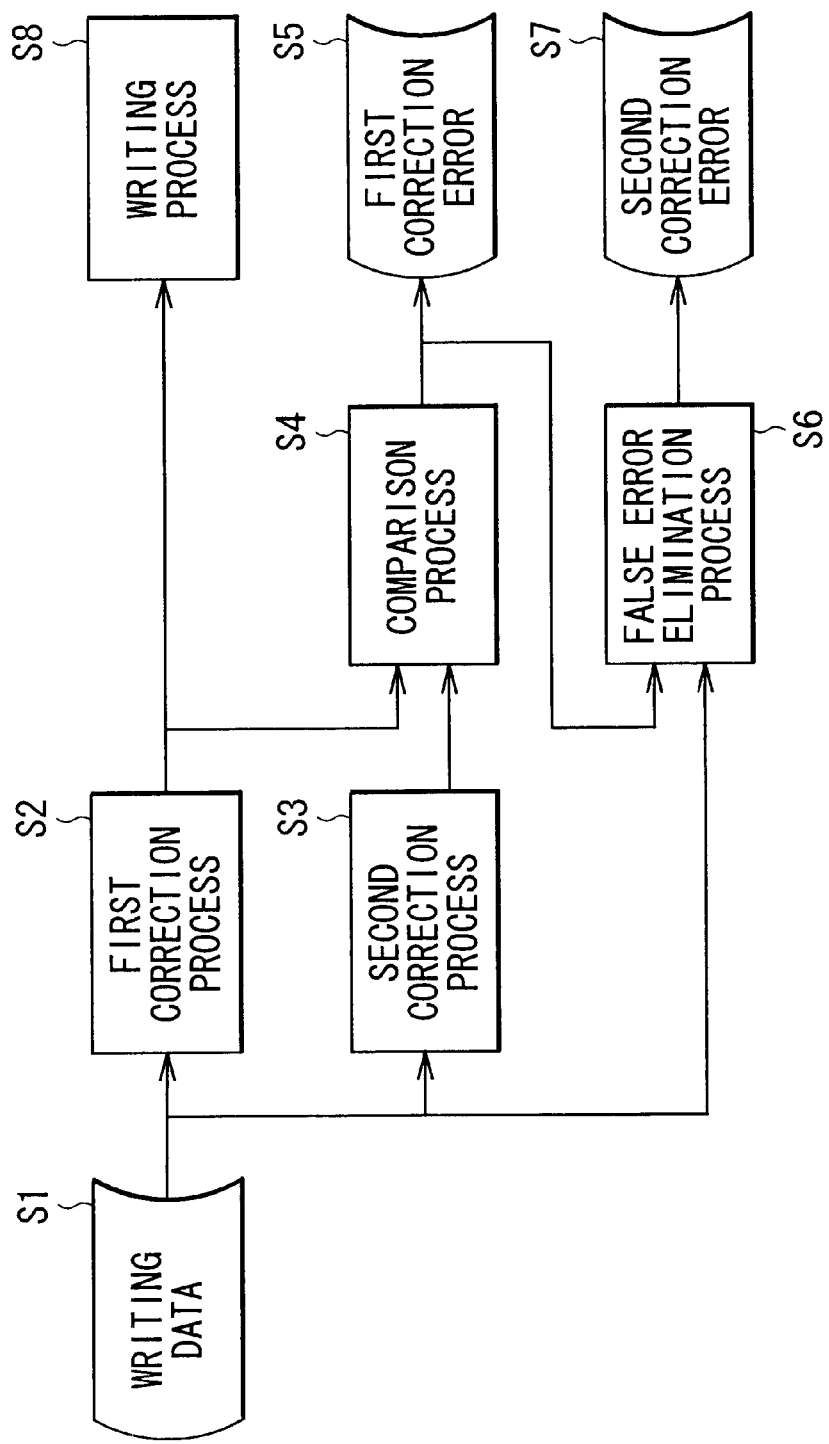
FIG. 2 is a block diagram describing a method for mask data verification according to the embodiment of the invention.

The embodiment of the present invention will be described hereinafter with accompanying drawings. FIG. 2 is a block diagram describing a method for mask data verification according to the embodiment. The embodiment is used to verify whether a corrected mask pattern is properly corrected, when a correction process accompanied by a change in the shape of a pattern, typified by an optical proximity effect correction (OPC), is carried out on a mask pattern written by mask data.

More specifically, in the embodiment, when a correction based on predetermined conditions for the correction such as OPC is carried out on mask data, by a plurality of programs (for example, two programs) each of which has a different algorithm, corrected mask data are prepared, compared with each other and verified based on the result of the comparison.

In other words, the method for mask data verification according to the embodiment comprises the steps of preparing writing data of a mask (S1) and carrying out the OPC process by a first program as a first correction process and determining the result of the first correction by calculation (S2).

In parallel with the first correction process, a second correction process into which the same writing data is input, is carried out and the result of a second correction is determined by calculation (S3). The second correction process uses a program with the same purpose as the first program and a different algorism from the first program.

Next, a comparison process between the results of the first correction and the second correction is carried out (S4). As a result of the comparison, if there are differences between the results of the first and the second corrections, the differences are output as first correction errors (S5). The first correction errors include errors which will cause problems in a subsequent process (photo lithography process) and errors (differences) which will cause no trouble. Therefore, a false error elimination process for eliminating false errors from the first correction errors is carried out (S6)

The false errors mean errors which will cause no trouble in the subsequent process in the first correction errors. By carrying out the false error elimination process, errors which will cause problems in the subsequent process are only output as second correction errors (S7). If the second errors are output, there is a correction error either in the first correction process or the second correction process, so either of the results which does not have the correction error is transferred to a writing process (S8).

A basic concept of the method for verification according to the embodiment is based on that when the programs with the same purpose have different algorithms, there is an extremely low possibility that both of the programs will make identical errors. In other words, as long as both of the programs are properly implemented, the results in a range indicated by specifications (the results based on the same conditions) should be identical.

However, if there is an ambiguous part in the specifications of the programs, there is a possibility that differences between the results processed by the both programs may arise.

For example, when a mask pattern with the line width shown in Table 1 is corrected, in a part where the line width of the mask pattern is clearly indicated, the identical results can be obtained by different programs. However, when the mask pattern is complicated, it is difficult to specify its line width, so there is a possibility that differences between the results of corrections due to different algorithms in the programs may arise.

Figure 3:
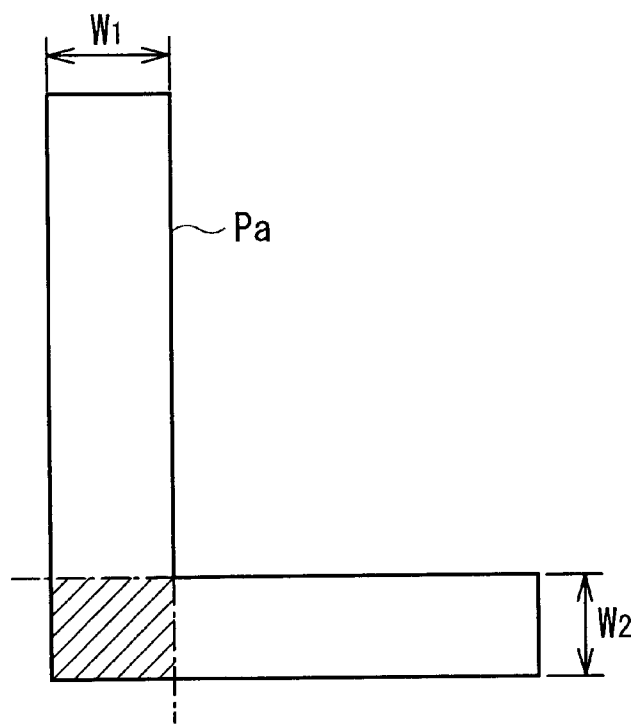
FIG. 3 is a schematic diagram showing an example of a complicated mask pattern.
Figure 4:
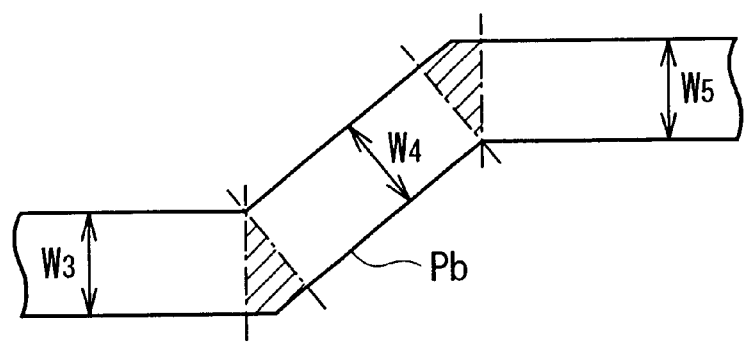
FIG. 4 is a schematic diagram showing another example of the complicated mask pattern.

Each of FIG. 3 and FIG. 4 shows a schematic diagram describing an example of a complicated mask pattern. FIG. 3 shows an example of a L-shaped mask pattern Pa composed of the line widths of $W_1$ and $W_2$. In the mask pattern Pa, for the correction of a diagonally shaded area in the drawing, it is not specified that either of the line widths of $W_1$ or $W_2$ is used, so the way of the correction depends on algorithms in the programs.

Further, a mask pattern Pb shown in FIG. 4 is composed of a combination of the line widths of $W_3$, $W_4$ and $W_5$. For the corrections of diagonally shaded areas in the drawing, it is not specified which width of $W_3$, $W_4$ and $W_5$ are used, so the way of the corrections depends on algorithms in the programs.

Figure 5A:
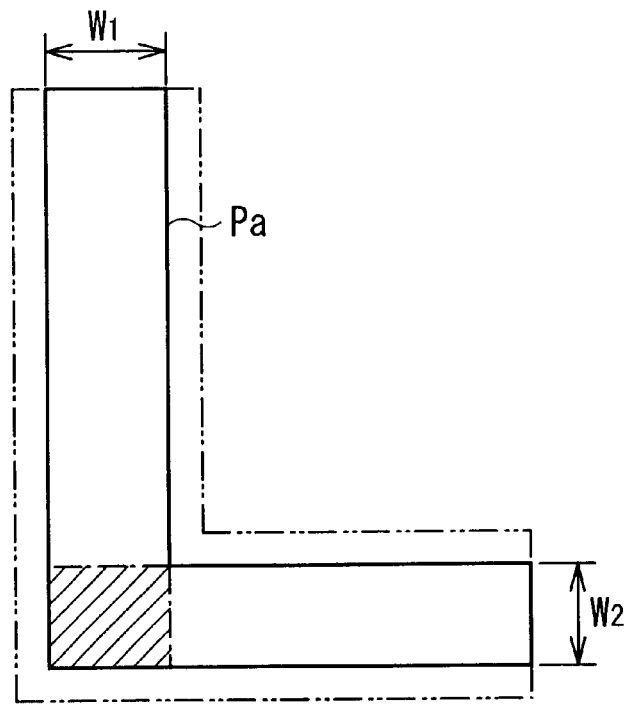
FIG. 5A and FIG. 5B are schematic diagrams showing examples of the corrections of the mask pattern shown in FIG. 3.
Figure 5B:
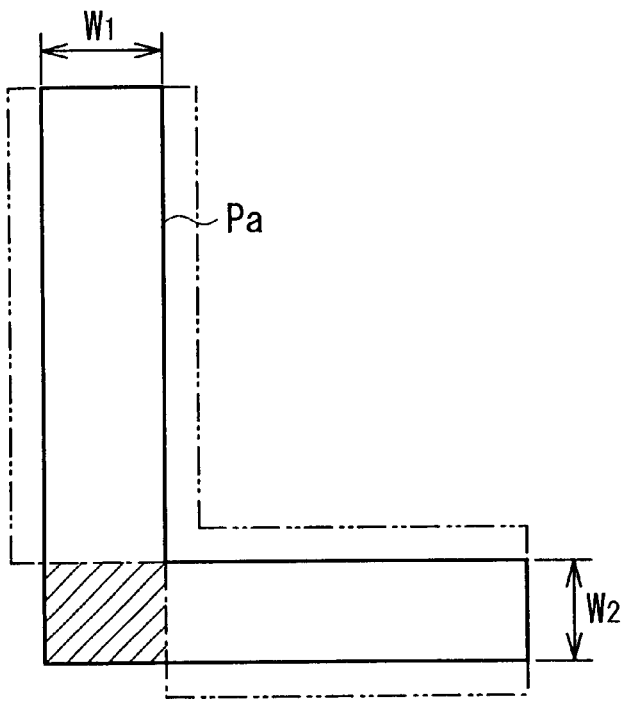

FIG. 5A and FIG. 5B are schematic diagrams showing examples of the corrections of the mask pattern shown in FIG. 3. FIG. 5A shows an example of the correction according to the first program and FIG. 5B shows an example of the correction according to the second program. In the both drawings, areas indicated by two-dot chain lines are corrected areas.

As shown in FIG. 5A, in the first program, an overlapped area (the diagonally shaded area in the drawing) of the mask pattern Pa is corrected in the same manner of the other areas. On the other hand, as shown in FIG. 5B, in the second program, the overlapped area (the diagonally shaded area in the drawing) of the mask pattern Pa is not corrected. It is because of a difference of algorithms between the both programs, and the algorithms based on their own concept are constructed for the areas where the specifications are ambiguous.

Figure 6A:
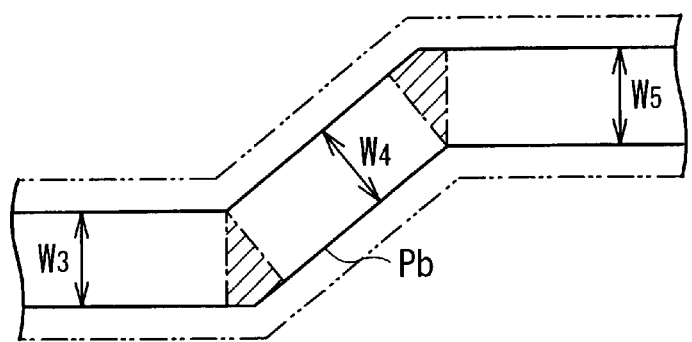
FIG. 6A and FIG. 6B are schematic diagrams showing examples of the corrections of the mask pattern shown in FIG. 4.
Figure 6B:
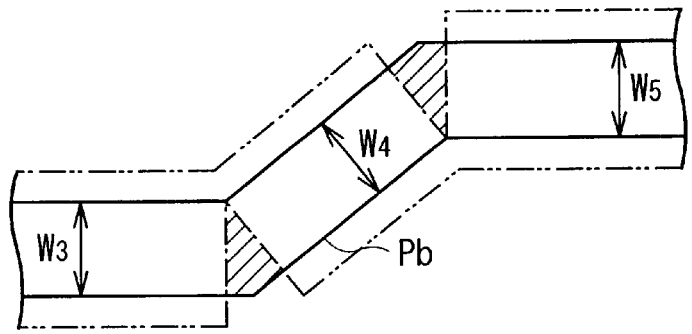

Further, each of FIG. 6A and FIG. 6B shows a schematic diagrams of an example of the correction of the mask pattern shown in FIG. 4. FIG. 6A shows an example of the correction according to the first program and the FIG. 6B shows an example of the correction according to the second program. In both drawings, areas indicated by two-dot chain lines are corrected areas.

As shown in FIG. 6A, in the first program, bending areas of the mask pattern Pb (areas indicated by broken lines) are corrected in the same manner of other areas. On the other hand, as shown in FIG. 6B, in the second program, the outsides of bending areas of the mask pattern Pb (areas indicated by broken line) are not corrected. Likewise, it is because of a difference of algorithms between both programs, and the algorithms based on their own concept are constructed for the areas where the specifications are ambiguous.

Figure 7A:
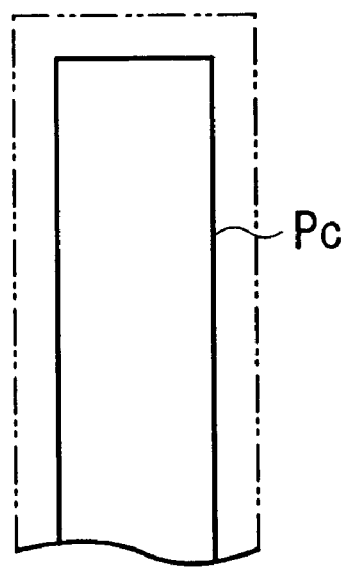
FIG. 7A and FIG. 7B are schematic diagrams showing examples of the corrections of an end of a mask pattern.
Figure 7B:
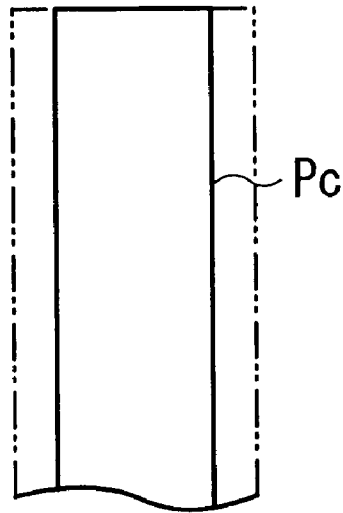

Further, each of FIG. 7A and FIG. 7B shows a schematic diagram of an example of an end of the mask pattern. FIG. 7A shows an example of the correction according to the first program and FIG. 7B shows an example of the correction according to the second program. In both drawings, areas indicated by two-dot chain line are corrected areas.

As shown in FIG. 7A, in the first program, an end of a mask pattern Pc is corrected in the same manner of the other areas. On the other hand, as shown in FIG. 7B, in the second program, the end of the mask pattern Pc is not corrected. Likewise, it is because of a difference of algorithms between the both programs, and the algorithms based on their own concept are constructed for the areas where the specifications are ambiguous.

Thus, differences between the programs each of which has a different algorithm in the results of corrections may arise. In the first correction error shown in FIG. 2, differences between the result of the first correction by the first program and the result of the second correction by the second program are simply indicated.

In the embodiment, a process for eliminating false errors from the first correction errors is carried out, and only correction errors which cause problems in the subsequent process are extracted. In the false error elimination process, there are cases that the differences in the results of corrections due to the difference of algorithms between the both programs shown in FIG. 5A through FIG. 7B are considered as false errors, and not considered as false errors.

In other words, the differences in the results of the corrections due to the differences of the algorithms between the both programs shown in FIG. 5A through FIG. 7B arise in areas where the specifications are ambiguous, so most of them basically cause no trouble in the subsequent process. When the differences can be considered not to cause any trouble in relation to other mask pattern layouts, the differences in the results of the corrections shown in FIG. 5A through FIG. 7B are eliminated from the first correction error as false errors in the false error elimination process.

On the other hand, when the differences in the results of the corrections shown in FIG. 5A through FIG. 7B cause problems in the subsequent process in relation to other mask pattern layouts, the differences are not considered as false errors so the differences are not eliminated.

If the conditions of the false errors can be specified, the false errors can be easily eliminated by DRC which is general-use software used in a design process. By eliminating the false errors from the first correction errors, bugs in the programs and errors which occur due to a sporadic problem in a computing apparatus and affect the subsequent process can be extracted as the second correction errors.

The false errors depend on algorithms in the both programs. When the programs are changed, false errors arisen due to differences of the algorithms between the programs are newly registered. Thereby, errors in the results of corrections by the programs can be accurately detected.

Further, in the embodiment, by using a plurality of programs each of which has a different algorithms, a plurality of results of corrections are produced, and by carrying out the first correction process (S2) in parallel with the second correction process (S3) as shown in FIG. 2, a delay in calculation time can be prevented.

Further, in the embodiment, the first correction process (S2), the second correction process (S3), the comparison process (S4) and the false error elimination process (S6) shown in FIG. 2 may be implemented as software and stored in a medium such as a CD-ROM (Compact Disc-Read Only Memory). In other words, by installing a program composed of the embodiment on a computing apparatus by the CD-ROM, the embodiment can be implemented on a desired computing apparatus.

Moreover, in the embodiment as described above, two programs are used to produce the results of the corrections of the mask pattern, but in the present invention, programs are not limited to two, but three or more programs can be used. Also, for the corrections of the mask pattern, the OPC process is used but any other correction processes are applicable.

As described above, according to the present invention, errors which cause problems as mask data can be accurately extracted from the differences among mask data corrected by a plurality of programs, so the mask data can be accurately verified. Further, errors due to the algorithms in programs or errors due to a sporadic problem in a computing apparatus can be detected, so adverse effects to the subsequent process due to these errors can be reliably prevented.

Obviously many modifications and variations of the present invention are possible in the light of the above teachings. It is therefore to be understood that within the scope of the appended claims the invention may be practiced otherwise than as specifically described.

What is claimed is:

1. A method for mask data verification comprising the steps of:

preparing corrected mask data by each of a plurality of programs, each program having a different algorithm for generating the mask data;

comparing each of the corrected mask data which are prepared in the previous step; and as a result of the comparison, if there are a plurality of differences, among the corrected mask data, eliminating errors, which cause no trouble as mask data from the differences, and extracting errors which cause trouble, as mask data from remaining differences.

2. A computer readable recording medium recording a verification program for verifying mask data, the verification program comprising the steps of:

preparing corrected mask data by each of a plurality of programs each program having a different algorithm for generating the mask data;

comparing each of the corrected mask data which are prepared in the previous step; and as a result of the comparison, if there are a plurality of differences, among the corrected mask data, eliminating errors, which cause no trouble as mask data from the remaining differences.

* * * * *